(12) United States Patent
Favaretto

(10) Patent No.: US 11,230,193 B2
(45) Date of Patent: Jan. 25, 2022

(54) ROAD VEHICLE WITH ELECTRIC DRIVE AND POWER WIRING COOLING

(71) Applicant: FERRARI S.p.A., Modena (IT)

(72) Inventor: Fabrizio Favaretto, Formigine (IT)

(73) Assignee: FERRARI S.P.A., Modena (IT)

(*) Notice: Subject to any disclaimer, the term of this patent is extended or adjusted under 35 U.S.C. 154(b) by 274 days.

(21) Appl. No.: 16/435,903

(22) Filed: Jun. 10, 2019

(65) Prior Publication Data

US 2019/0389310 A1 Dec. 26, 2019

(30) Foreign Application Priority Data

Jun. 11, 2018 (IT) .................. 102018000006208

(51) Int. Cl.
| | | |
|---|---|---|
| *B60L 1/02* | (2006.01) | |
| *B60L 50/51* | (2019.01) | |
| *B60H 1/00* | (2006.01) | |
| *B60H 1/32* | (2006.01) | |
| *B60K 1/04* | (2019.01) | |

(Continued)

(52) U.S. Cl.
CPC ............ *B60L 1/02* (2013.01); *B60H 1/00271* (2013.01); *B60H 1/3227* (2013.01); *B60K 1/04* (2013.01); *B60K 11/02* (2013.01); *B60K 11/04* (2013.01); *B60L 50/51* (2019.02); *B60L 53/20* (2019.02); *H01B 7/423* (2013.01); *H05K 7/20881* (2013.01); *H05K 7/20936* (2013.01); *B60H 2001/00307* (2013.01); *B60K 6/48* (2013.01); *B60K 2001/005* (2013.01); *B60K 2001/006* (2013.01); *B60K 2001/0416* (2013.01);

(Continued)

(58) Field of Classification Search
CPC ........... B60L 53/20; B60K 1/04; H01B 7/423; H05K 7/20936
See application file for complete search history.

(56) References Cited

U.S. PATENT DOCUMENTS 6,323,613 B1 * 11/2001 Hara ..................... B60L 15/20
                                                                318/471
7,032,695 B2 * 4/2006 Beihoff .................. B60L 50/15
                                                                180/65.1

(Continued)

FOREIGN PATENT DOCUMENTS

| EP | 2270918 A1 | 1/2011 |
|---|---|---|
| FR | 2962376 A1 | 1/2012 |

OTHER PUBLICATIONS

Search Report issued in Italian Application No. 201800006208, completed Mar. 6, 2019; 7 pages.

*Primary Examiner* — James A Shriver, II
*Assistant Examiner* — James J Triggs
(74) *Attorney, Agent, or Firm* — Cantor Colburn LLP

(57) ABSTRACT

A road vehicle with an electric drive comprising: at least one pair of drive wheels; a reversible electric machine, which can be connected to the drive wheels; an electronic power converter, which controls the electric machine; an electric energy storage system, which is connected to the electronic power converter; first power wirings comprising at least two first electric wires, which connect the electric machine to the electronic power converter; and second power wirings comprising at least two second electric wires, which connect the electronic power converter to the storage system; and a cooling system, which is thermally coupled to at least one power wiring in order to remove heat from the power wiring.

18 Claims, 7 Drawing Sheets

(51) Int. Cl.
  *B60K 11/04* (2006.01)
  *H01B 7/42* (2006.01)
  *H05K 7/20* (2006.01)
  *B60K 11/02* (2006.01)
  *B60L 53/20* (2019.01)
  *B60K 6/48* (2007.10)
  *B60K 1/00* (2006.01)

(52) U.S. Cl.
  CPC ....... *B60L 2210/40* (2013.01); *B60Y 2200/92* (2013.01); *B60Y 2300/00* (2013.01)

(56) References Cited

U.S. PATENT DOCUMENTS

| | | | |
|---|---|---|---|
| 9,131,629 B2* | 9/2015 | Steinberg | H05K 7/20927 |
| 2013/0269966 A1* | 10/2013 | Emme | H01B 7/423 |
| | | | 174/15.6 |
| 2015/0243411 A1* | 8/2015 | Maeda | H01B 7/423 |
| | | | 174/47 |
| 2017/0232866 A1 | 8/2017 | Sugizaki | |

* cited by examiner

ROAD VEHICLE WITH ELECTRIC DRIVE AND POWER WIRING COOLING

CROSS-REFERENCE TO RELATED APPLICATIONS

This Patent application claims priority from Italian Patent Application No. 102018000006208 filed on Jun. 11, 2018, the entire disclosure of which is incorporated herein by reference.

TECHNICAL FIELD

The invention relates to a road vehicle with electric drive.

The invention finds advantageous application in a road vehicle with hybrid drive, to which explicit reference will be made in the description below without because of this loosing in generality.

PRIOR ART

A hybrid vehicle comprises an internal combustion engine, which transmits a torque to the drive wheels by means of a drivetrain provided with a transmission, and at least one electric machine, which is mechanically connected to the drive wheels and is electrically connected to an electric energy storage system. The electric energy storage system normally comprises a pack of chemical batteries, which are connected to one another in parallel or in series.

In use, all electric components are subjected to losses of electric energy (for example, though not only, due to a Joule effect), which turn into heat, which, hence, must be properly disposed of. As a consequence, in a hybrid vehicle there must be a cooling system dedicated to electric components (i.e. to the electric machine, to the electronic power converter and to the storage system) so as to prevent said electric components from overheating; in particular, the temperature of the electric components must remain relatively low both in order to avoid jeopardizing ("burning") the plastic material insulating elements and because the electrical resistance of metal conductors linearly increases as the temperature increases and, thus, when the temperature increases, the energetic efficiency of the metal conductors decreases.

Patent application US2004118142A1 describes how to use part of the cold generated by an air conditioning system of the passenger compartment to cool the electric components, i.e. the storage system, the electric machine and the electronic power converter.

Patent application EP2233340A2 describes, for a hybrid drive vehicle, a common cooling system, which is shared by an internal combustion heat engine and by the electric components (i.e. the electric machine, the electronic power converter and the storage system).

Patent application EP2270918A1 describes a cooling system for an electric drive vehicle, said cooling system being completely independent of and separate from an air conditioning system of the passenger compartment and using a compression refrigeration cycle to cool the electric components (i.e. the electric machine, the electronic power converter and the storage system).

Patent application EP2357336A1 describes a cooling system for a hybrid drive vehicle; the cooling system has: a hydraulic circuit where a cooling fluid flows and which is provided with a main branch, which cools a heat engine, and with a secondary branch, which cools electric components; at least one common radiator, which comprises a first portion, which is normally used by the main branch of the hydraulic circuit and has at least two tanks arranged at the ends, and a second portion, which is normally used by the secondary branch of the hydraulic circuit and has at least two tanks arranged at the ends; first connection means, which alternatively establish a communication between a first tank of the first portion and a second tank of the second portion or keep the first tank of the first portion isolated from the second tank of the second portion; and second connection means, which alternatively establish a communication between a third tank of the first portion and a fourth tank of the second portion or keep the third tank of the first portion isolated from the first tank of the second portion.

DESCRIPTION OF THE INVENTION

The object of the invention is to provide a road vehicle with a hybrid drive, in which the energetic efficiency is improved in a simple manner.

According to the invention, there is provided a road vehicle with electric drive according to the appended claims.

The appended claims describe preferred embodiments of the invention and form an integral part of the description.

BRIEF DESCRIPTION OF THE DRAWINGS

The invention will now be described with reference to the accompanying drawings, which show some non-limiting embodiments thereof, wherein.

PREFERRED EMBODIMENTS OF THE INVENTION

Figure 1:
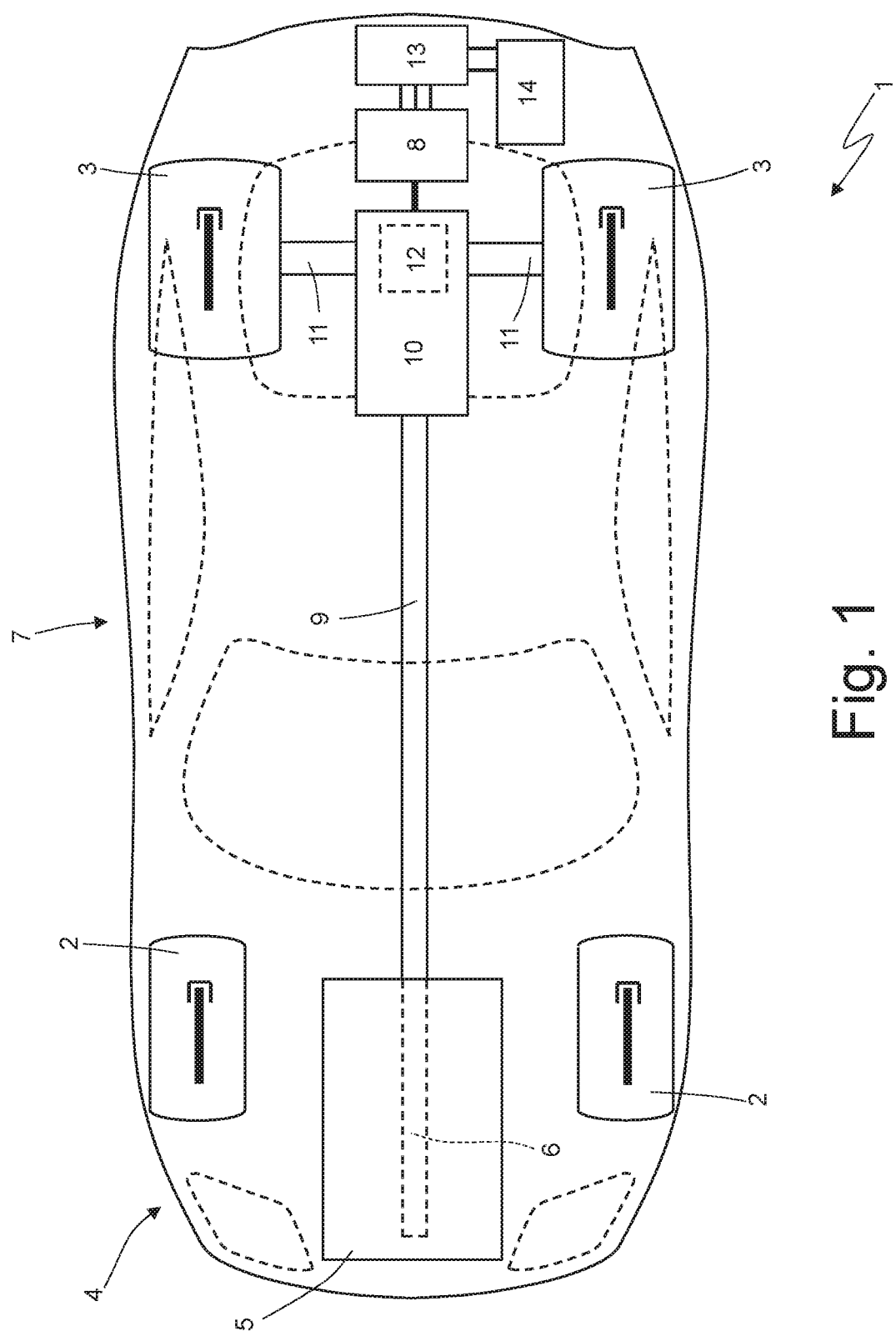
FIG. 1 is a schematic plan view of a road vehicle with hybrid drive.

In FIG. 1, number 1 indicates, as a whole, a road vehicle with hybrid drive, which is provided with two front wheels 2 and two rear drive wheels 3, which receive the torque from a hybrid powertrain system 4.

The hybrid powertrain system 4 comprises: an internal combustion heat engine 5, which is arranged in a front position and is provided with a crankshaft 6, an automatic drivetrain 7, which transmits the torque generated by the internal combustion engine 5 to the rear drive wheels 3, and an electric machine 8, which is mechanically connected to the drivetrain 7 and is reversible (i.e. it can work both as an electric motor, absorbing electric energy and generating a mechanical torque, and as an electric generator, absorbing mechanical energy and generating electric energy).

The drivetrain 7 comprises a drive shaft 9, which, on one side, is angularly integral to the crankshaft 6 and, on the other side, is mechanically connected to a dual-clutch transmission 10, which is arranged in a rear position and transmits the motion to the rear drive wheels 3 by means of two axle shafts 11, which receive the motion from a differential 12. The electric machine 8 is mechanically connected to the transmission 10 and, in particular, is angularly integral to a primary shaft of the transmission 10; as to the ways in which the electric machine 8 is connected to the dual-clutch transmission 10, reference is made, for example, to the description of patent application EP2325034A1.

The electric machine 8 is controlled by an electronic DC-AC power converter 13 (i.e. an "inverter"), which, on one (AC) side, is connected to the electric machine 8 and, on the other (DC) side, is connected to an electric energy storage system 14 provided with chemical batteries.

Figure 2:
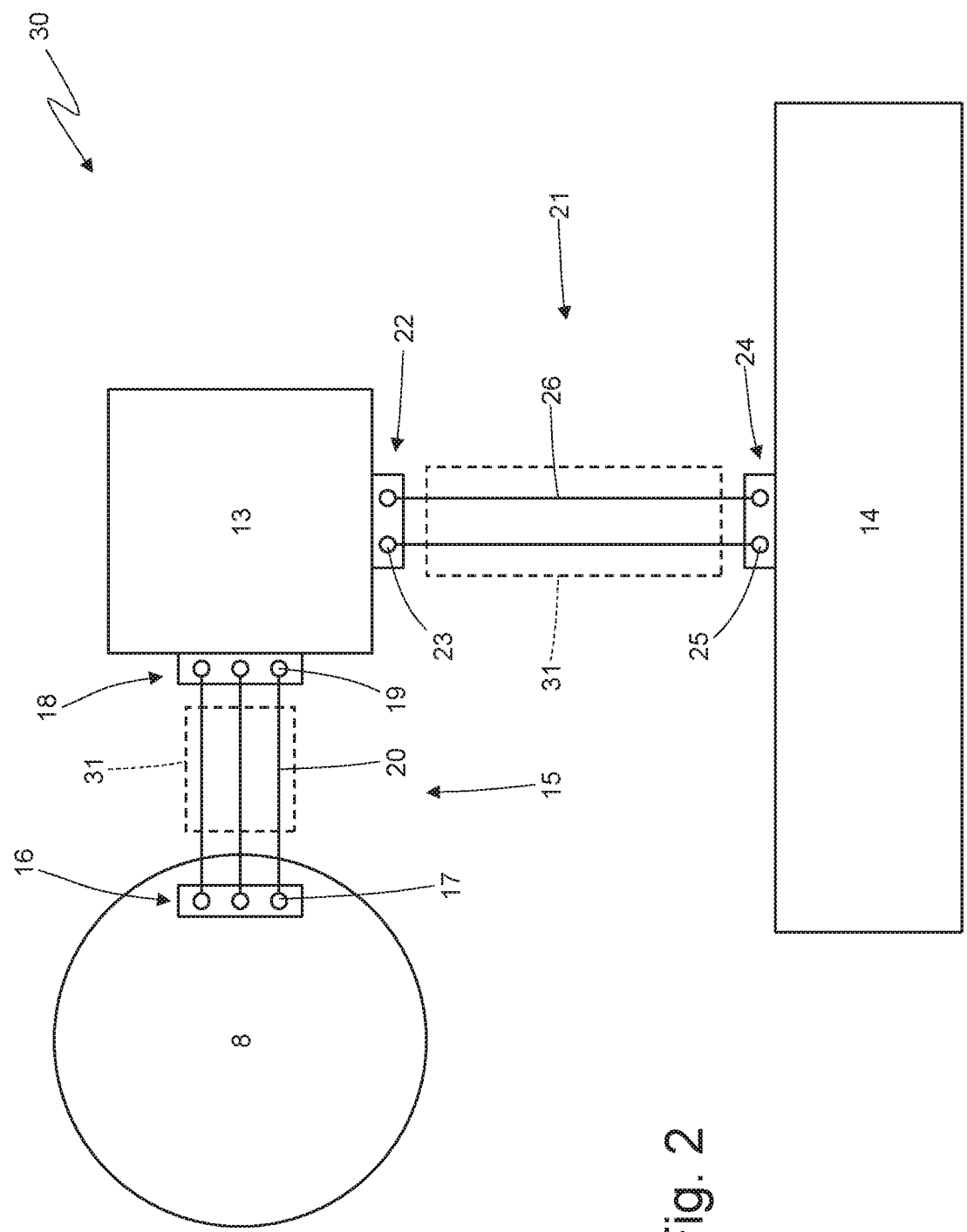
FIG. 2 is a schematic view of an electric drive system of the road vehicle of FIG. 1.

According to FIG. 2, an (AC) power wiring 15 is provided, which electrically connects a terminal board 16 (provided with the three terminals 17) of the electric machine 8 to a terminal board 18 (provided with three terminals 19) of the electronic power converter 13; the power wiring 15 comprises three electric wires 20, each fixed, at one end, to a terminal 17 of the terminal board 16 of the electric machine 8 and, at an opposite end, fixed to a terminal 19 of the terminal board 18 of the electronic power converter 13.

According to FIG. 2, a (DC) power wiring 21 is provided, which electrically connects a terminal board 22 (provided with the three terminals 23) of the electronic power converter 13 to a terminal board 24 (provided with three terminals 25) of the storage system 15; the power wiring 21 comprises two electric wires 26, each fixed, at one end, to a terminal 23 of the terminal board 22 of the electronic power converter 13 and, at an opposite end, fixed to a terminal 25 of the terminal board 24 of the storage system 15.

Figure 3:
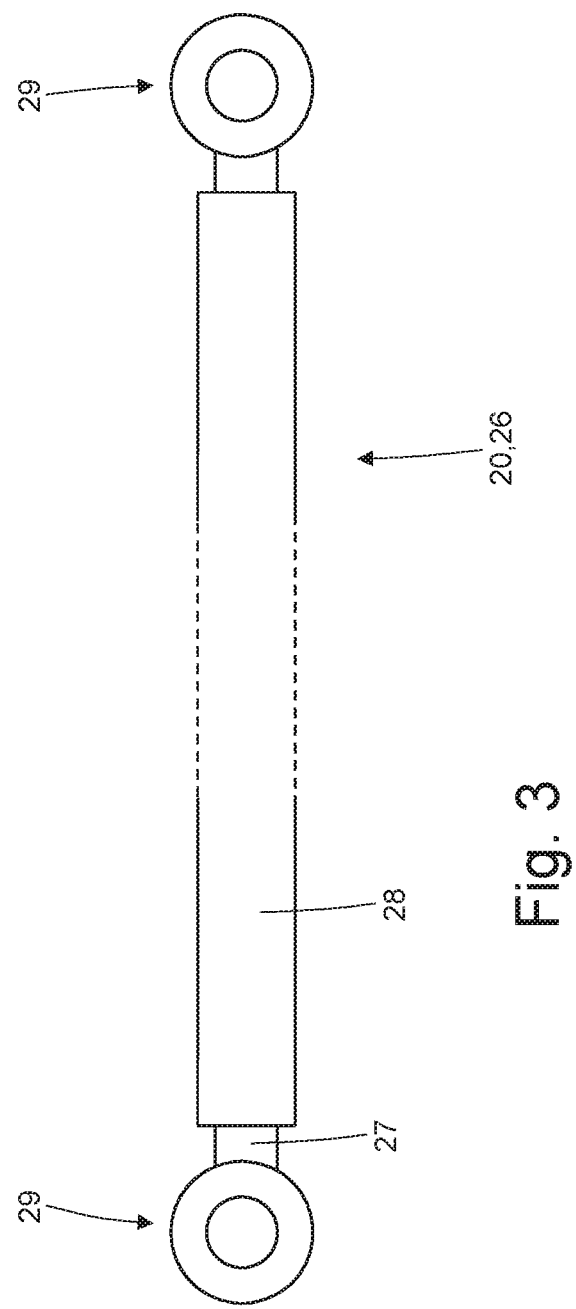
FIG. 3 is a schematic view of an electric wire of the electric drive system of FIG. 2.

According to FIG. 3, each electric wire 20 or 26 is an electric component fulfilling the function of transmitting electric current for the transportation of electric energy and consisting of a core 27, which is made of a conductor material (normally copper and generally consisting of a bundle of thin threads so as to be flexible) and covered by an (electrically) insulating jacket 28 (namely, an electrically insulating layer). In the area of the two opposite ends, each electric wire 20 or 26 is naked (namely, it has no insulating jacket 28), thus exposing the conductor material core 27 to which a head 29 (for example a ring-shaped head, as shown in FIG. 3) is steadily connected, which ensures an easy and safe connection to a corresponding terminal 17, 19, 23 or 25. In other words, each end 29 constitutes a wire terminal in which the conductor material core 27 of an electric cable 20 or 26 is fitted in order to allow for an easy and safe connection of the electric wire 20 or 26 to the corresponding terminal 17, 19, 23 o 25.

According to FIG. 2, a cooling system 30 is provided, which is designed to remove heat and, in particular, is thermally coupled to the power wirings 15 and 21 in order to remove heat from the power wirings 15 and 21.

In embodiment shown in FIG. 2, the cooling system 30 is thermally coupled to the sole insulating jacket 28 of the electric wires 20 and 26 in order to remove heat from an outer surface of the insulating jacket 28. In particular, the cooling system 30 comprises a heat exchanger 31, which is (thermally) coupled to the wires 20 of the power wiring 15, and a heat exchanger 31, which is (thermally) coupled to the wires 26 of the power wiring 21. For example, each heat exchanger 31 could have different tubular bodies, each surrounding, namely being arranged around, a corresponding electric wire 20 or 26; in this way, each heat exchanger 31 removes (receives) the heat going through the outer surface of the insulating jacket 28 of a corresponding electric wire 20 or 26. Alternatively, each heat exchanger 31 could have different tubular bodies, each arranged inside a corresponding electric wire 20 or 26 so as to cool the electric wire 20 or 26 from the inside.

Figure 4:
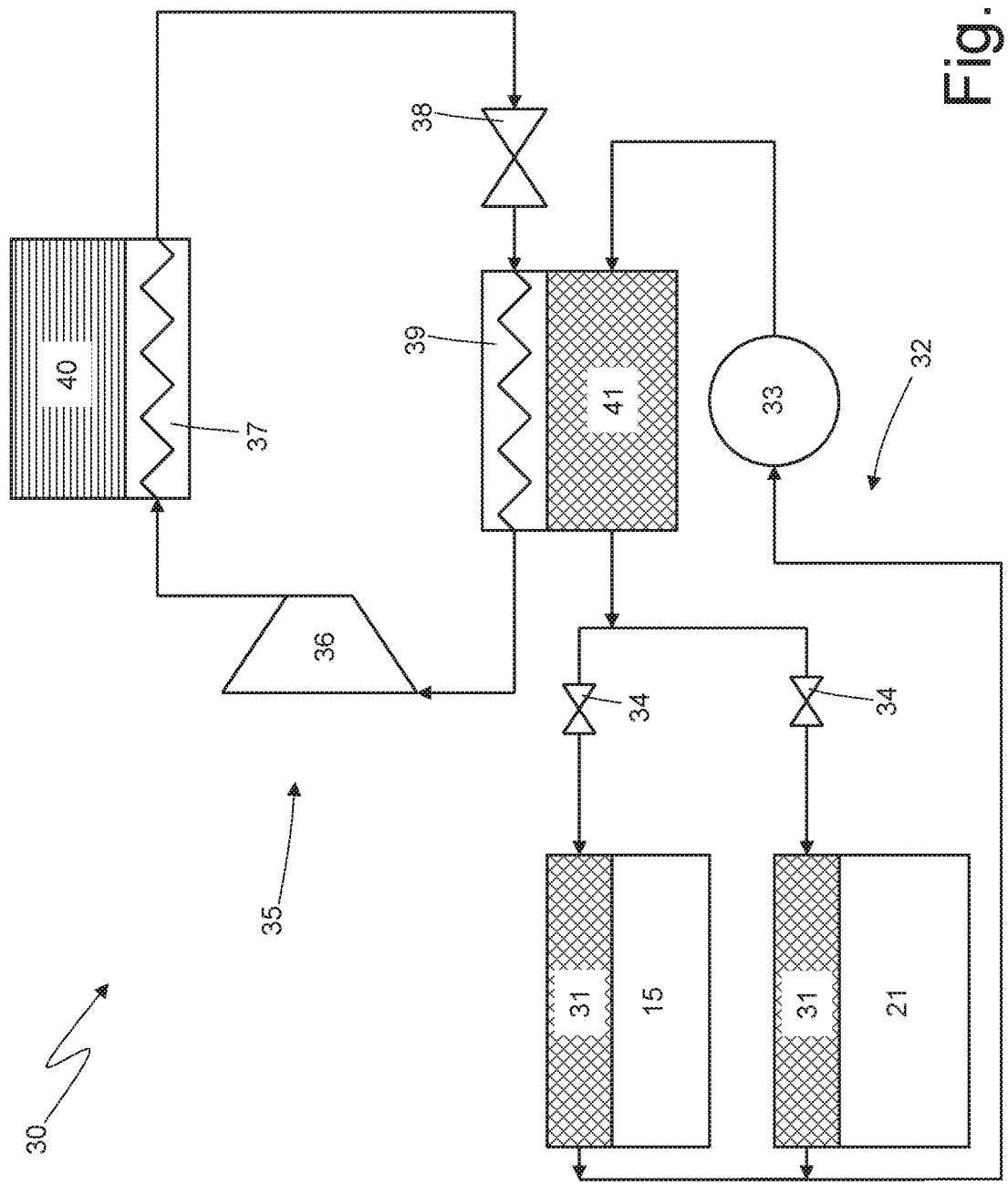
FIG. 4 is a schematic view of a cooling system coupled to the electric drive system of FIG. 2.

According to FIG. 4, the cooling system 30 comprises a cooling circuit 32, where a cooling fluid (for example, water with the addition of anti-freeze and anti-corrosion agents or oil) flows and which is provided with two heat exchangers 31, which are thermally coupled to the power wirings 15 and 21 in order to remove heat from the power wirings 15 and 21. Furthermore, the cooling circuit 32 comprises an electrically operated circulation pump 33, which causes the cooling fluid to flow; the two heat exchangers 31 are connected to one another in parallel and are connected to the circulation pump 33 in series. According to a possible embodiment shown in FIG. 4, a solenoid valve 34 is arranged in series to each heat exchanger 31 and is electrically adjustable so as to change (from zero to a maximum value) the flow rate of the cooling fluid flowing through the heat exchanger 31.

According to a possible embodiment which is not shown herein, the cooling circuit 32 is provided with an air radiator, which is hit by an air flow when the vehicle 1 is moving and where the cooling fluid releases heat to the outside; according to a preferred embodiment, the radiator is also provided with an electric fan, which is controlled by a thermostat so as to forcedly cool down, in case of need, the radiator.

According to an alternative embodiment shown in FIG. 4, instead of the air radiator there is provided a refrigeration circuit 35, which implements a compression refrigeration cycle, contains a refrigeration fluid (for example HCFCs or hydrochlorofluorocarbons) and comprises, in turn, a compressor 36, a condenser 37, an expansion valve 38 (or lamination valve) and an evaporator 39. The condenser 37 is thermally coupled to an air radiator 40, which is hit by an air flow when the vehicle 1 is moving so as to disperse the heat present in the condenser 37 in the environment; according to a preferred embodiment, the radiator 40 is also provided with an electric fan, which is controlled by a thermostat so as to forcedly cool down, in case of need, the radiator 40. The cooling circuit 32 comprises a heat exchanger 41, which is thermally coupled to the evaporator 39 in order to release heat to the evaporator 39.

Figure 5:
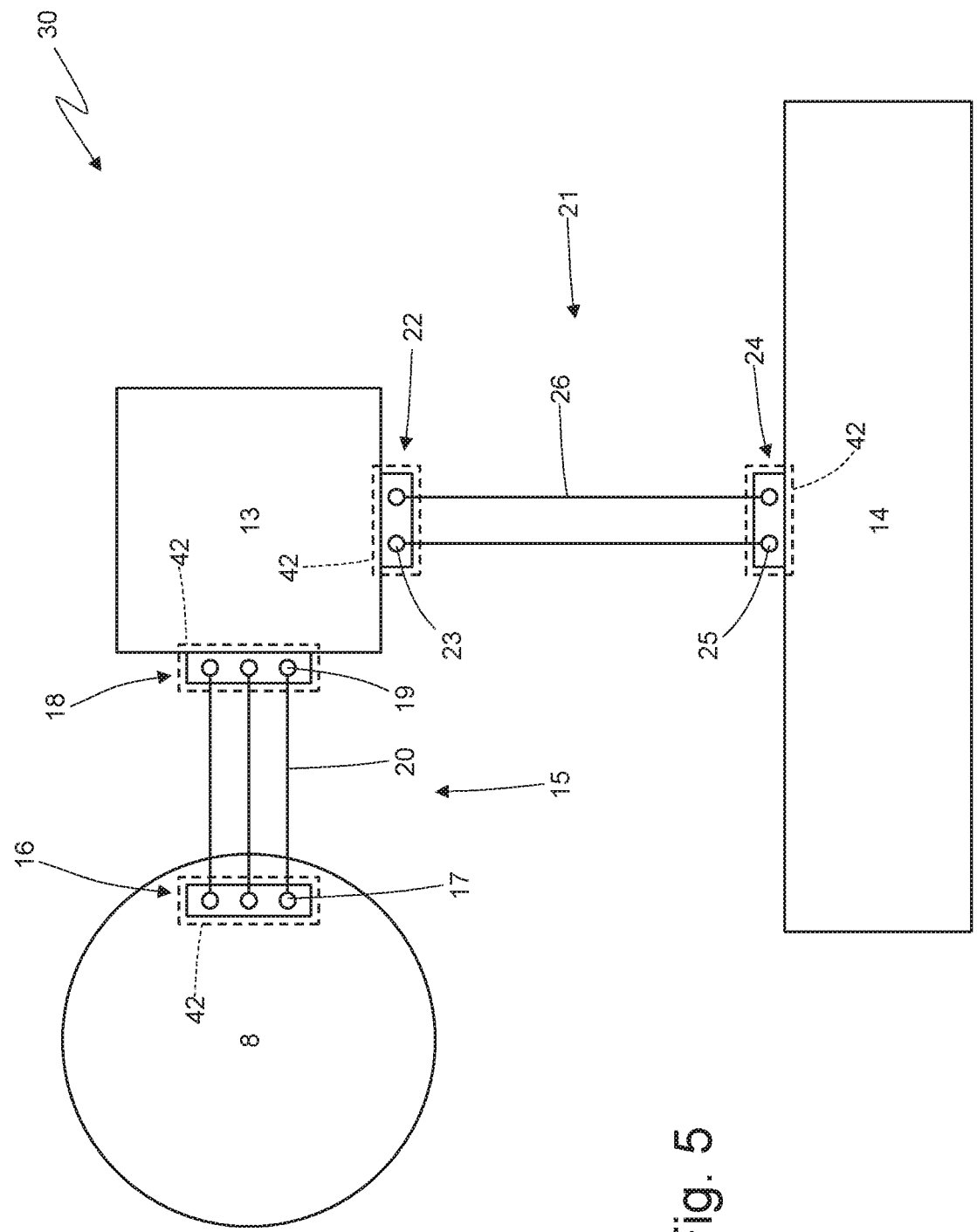
FIG. 5 is a schematic view of a variant of the electric drive system of FIG. 2.

In the embodiment shown in FIG. 5, the cooling system 30 is thermally coupled to the heads 29 of the electric wires 20 and 26 of the two power couplings 15 and 21 in order to remove heat from the heads 29 (which, as already mentioned above, are "naked", namely have no insulating jacket 28). In particular, the cooling system 30 comprises a heat exchanger 42, which is (thermally) coupled to the heads 29 of the wires 20 arranged in the terminal board 16, a head exchanger 42, which is (thermally) coupled to the heads 29 of the wires 20 arranged in the terminal board 18, a heat exchanger 42, which is (thermally) coupled to the heads 29 of the wires 26 arranged in the terminal board 22, and a heat exchanger 42, which is (thermally) coupled to the heads 29 of the wires 26 arranged in the terminal board 24.

Figure 6:
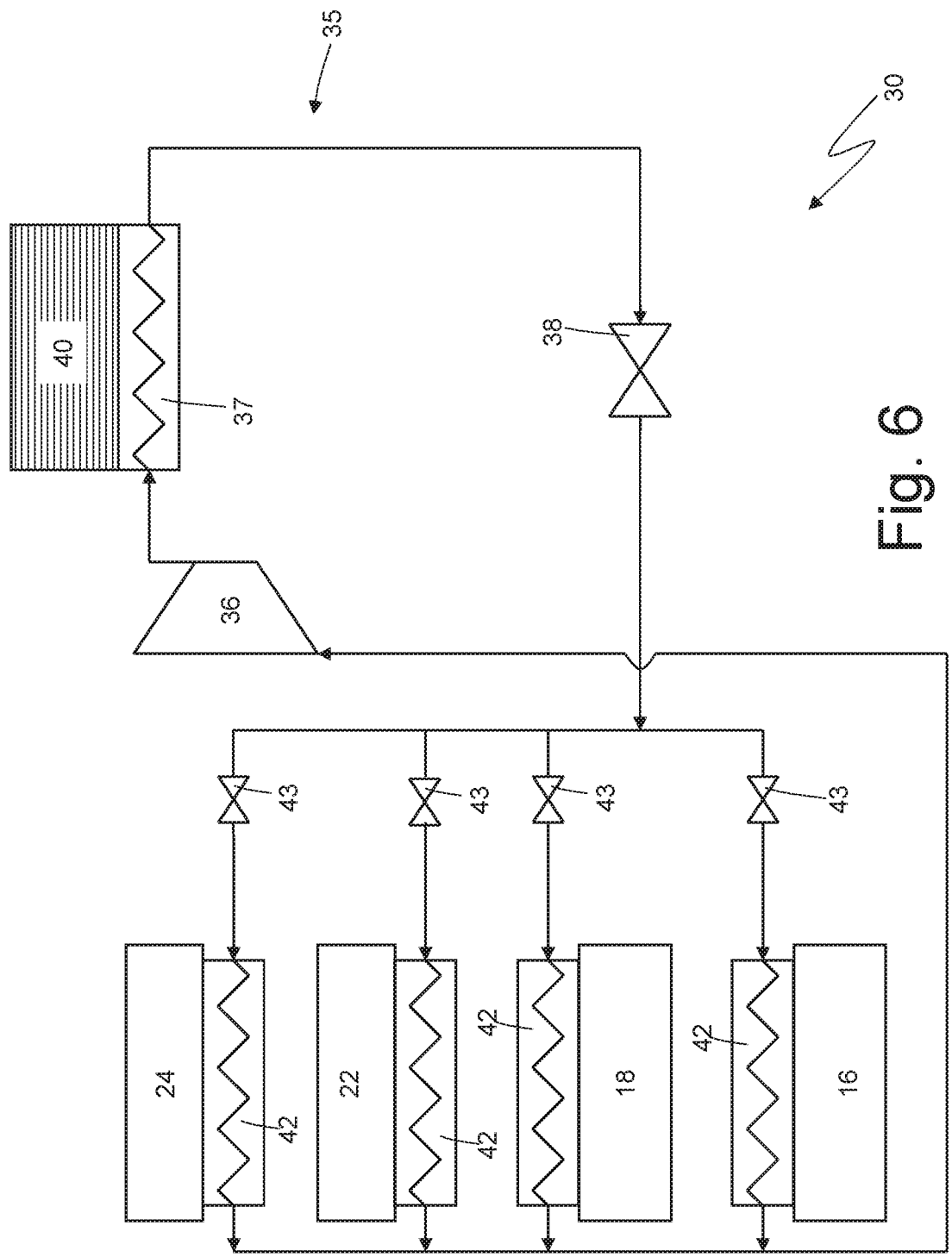
FIG. 6 is a schematic view of a cooling system coupled to the electric drive system of FIG. 5.

According to a possible embodiment shown in FIG. 6, each heat exchanger 42 rests against the corresponding terminal board 16, 18, 22 or 24 in order to extract heat from the terminal board 16, 18, 22 or 24 and, hence, from the heads 29 of the corresponding electric wires 20 and 26.

In the embodiment shown in FIG. 4, there are provided a refrigeration circuit 35, which uses a refrigeration cycle to generate cold, and a cooling circuit 32, which is independent of the refrigeration circuit 35, receives cold from (i.e. releases heat to) the refrigeration circuit 35 and cools down the power wirings 15 and 21. In other words, the refrigeration circuit 35 does not directly cool down the power wirings 15 and 21, but it indirectly cools down the power wirings 15 and 21 through the interposition of the cooling circuit 32.

In the embodiment shown in FIG. 6, the cooling circuit 32 is absent and the refrigeration circuit 35 directly cools down the power wirings 15 and 21; as a consequence, the refrigeration circuit 35 comprises four evaporators, which make up the four heat exchangers 42, are connected to one another in parallel and are thermally coupled to the respective power wirings 15 and 21. In other words, the evaporators of the refrigeration circuit 35 replace the heat exchangers 31 and are directly thermally coupled to the terminal boards 16, 18 22 and 24 (namely, to the heads 29 of the electric wires 20 and 26). According to a possible embodiment shown in FIG. 6, a solenoid valve 43 is arranged in series to each heat exchanger 42 and is electrically adjustable so as to change (from zero to a maximum value) the flow rate of the refrigeration fluid.

In the embodiment shown in FIG. 6, each heat exchanger 42 consists of an evaporation organ, which is physically separate from the corresponding power wiring 15 or 21, is thermally coupled to the corresponding wiring 15 or 21 and determines a fluid-tight insulation between the refrigeration fluid and the corresponding power wiring 15 or 21 (in other words, the corresponding power wiring 15 or 21 never comes into contact with the refrigeration fluid, since the refrigeration fluid remains in an environment which is separate and insulated from the terminal boards 16, 18, 22 and 24). In other words, the refrigeration fluid of the refrigeration circuit 35 never directly comes into contact with the corresponding power wirings 15 and 21, but it cools down the walls of the heat exchangers 42, which, in turn, cool down the corresponding power wirings 15 and 21.

Figure 7:
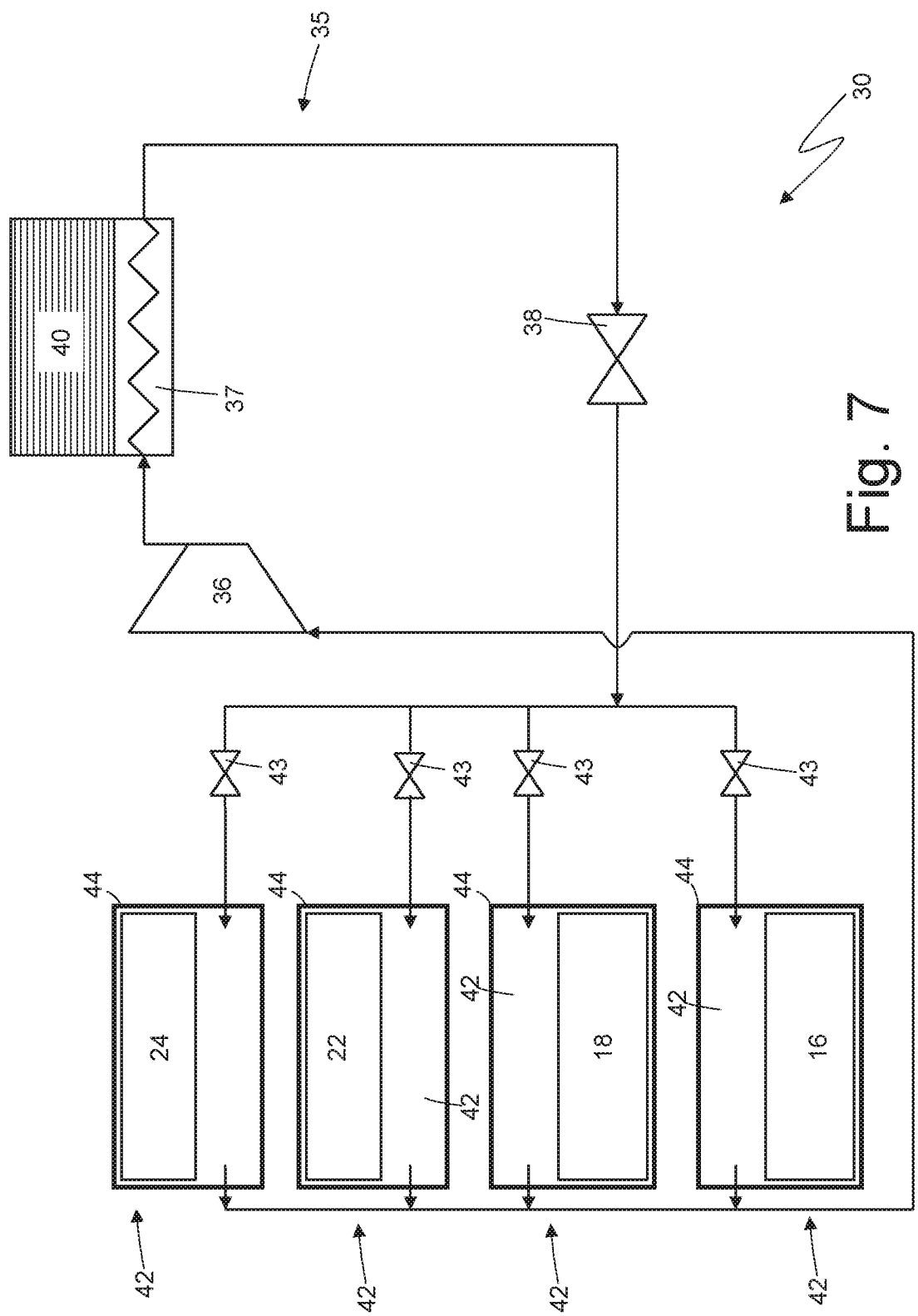
FIG. 7 is a schematic view of a variant of the cooling system of FIG. 6.

In the variant shown in FIG. 7, each terminal board 16, 18, 22 or 24 is inserted in a fluid-tight casing 44, which receives the refrigeration fluid from the expansion valve 38, sends the refrigeration fluid to the compressor 36 and constitutes the evaporator organ and, hence, the heat exchanger 42. As a consequence, an end part of the wirings 15 and 21 (namely, the heads 29 of the electric wires 20 and 26) is inserted in the corresponding casings 44 so as to be cooled down inside the casings 44, which make up the evaporator organs and, hence, the heat exchangers 42. In other words, in the variant shown in FIG. 7, the evaporation of the refrigeration fluid of the refrigeration circuit 35 takes place inside the casings 44, each manufactured in a fluid-tight manner and fulfilling the functions of an evaporator; this means that each casing 44 receives the refrigeration fluid from the expansion valve 38 and sends the refrigeration fluid to the compressor 36, allowing the refrigeration fluid to evaporate on the inside, directly removing heat from the heads 29 of the electric wires 20 and 26. In this embodiment, the refrigeration fluid of the refrigeration circuit 21 is in direct contact with the heads 29 of the electric wires 20 and 26 and, hence, cools down the heads 29 through direct contact (obviously, the refrigeration fluid must be electrically insulating). This cooling mode is more effective and efficient, since the refrigeration fluid of the refrigeration circuit 35 directly cools down the heads 29 of the electric wires 20 and 26, but, on the other ends, it forces manufacturers to produce the fluid-tight casings 44 (with particular constructive difficulties in the area of the passage openings for the electric wires 20 and 26).

According to a possible embodiment which is not shown herein, the diagram of the cooling system 30 shown in FIG. 4 (namely, provided with the cooling circuit 32) is used to cool down the heads 29 of the electric wires 20 and 26 (as shown in FIG. 5).

According to a further embodiment which is not shown herein, the diagram of the cooling system 30 shown in FIGS. 6 and 7 (namely, without the cooling circuit 32) is used to cool down the intermediate portions of the electric wires 20 and 26 (as shown in FIG. 2).

According to a possible embodiment, the cooling system 30 is not exclusively dedicated to the cooling of the power wirings 15 and 21, but it also cools down other electric components (for example the electric machine 8, the electronic power converter 13 and/or the electric energy storage system 14).

According to a possible embodiment, the cooling system 30 could share parts with or could have hydraulic connections to a cooling system of the internal combustion heat engine and/or an air conditioning system of the passenger compartment of the road vehicle 1.

The embodiments described herein can be combined with one another, without for this reason going beyond the scope of protection of the invention.

The road vehicle 1 described above has numerous advantages.

First of all, the road vehicle 1 described above allows for an improvement of the electric efficiency offering, thanks to the cooling system 30, and adequate cooling (namely, an efficient and effective cooling) of the power wirings 15 and 21. In other words, by reducing the operating temperature of the power wirings 15 and 21, the electrical resistance of the wirings 15 and 21 decreases as well and, hence, the power losses due to Joule effect, which take place in the power wirings 15 and 21, are reduced.

Furthermore, the cooling system 30 described above is particularly compact, especially in the embodiment shown in FIG. 5, in which only the heads 29 of the electric wires 20 and 26 are cooled down. The embodiment shown in FIG. 4, despite being very compact as it basically simply cools down the heads 29 of the electric wires 20 and 26 in the area of the terminal boards 16, 18, 22 and 24, which are relatively small, leads to a very effective and efficient cooling of the electric wires 20 and 26, since the heads 29 of the electric wires 20 and 26 are naked (i.e. have no insulating jacket 28, which is electrically insulating, but also inevitably thermally insulating) and, hence, allow for a very high cooling, despite being small-sized; furthermore, the cooling of the heads 29 of an electric wire 20 or 26 rapidly extends to the entire core 27 of the electric wire 20 or 26, since the copper making up the core 27 of the electric wire 20 or 26 is a very good heat conductor, hence, by removing heat at the ends of an electric wire 20 or 26 (namely, at the heads 29 of the electric wire 20 or 26), there basically is a complete cooling of the electric wire 20 or 26 (taking into account that the electric wires 20 and 26 are short, normally a few dozens centimeters, and have a large cross section).

LIST OF THE REFERENCE NUMBERS OF THE FIGS 1 road vehicle
2 front wheels
3 rear wheels
4 powertrain system
5 engine
6 crankshaft
7 drivetrain
8 electric machine
9 drive shaft
10 transmission
11 axle shafts 12 differential
13 electronic power converter
14 power storage system
15 power wiring
16 terminal board
17 terminals
18 terminal board
19 terminals
20 electric wire
21 power wiring
22 terminal board
23 terminals
24 terminal board
25 terminals
26 electric wire
27 core
28 insulating jacket
29 heads
30 cooling system
31 heat exchanger
32 cooling circuit
33 circulation pump
34 solenoid valve
35 refrigeration circuit
36 compressor
37 condenser
38 expansion valve
39 evaporator
40 air radiator
41 heat exchanger
42 heat exchanger
43 solenoid valve
44 casing

The invention claimed is:

1. A road vehicle (1) with an electric drive comprising:
at least one pair of drive wheels (3);
a reversible electric machine (8), which is connected to the drive wheels (3);
an electronic power converter (13), which controls the electric machine (8);
an electric energy storage system (14), which is connected to the electronic power converter (13);
a first power wiring (15) comprising at least two first electric wires (20), which connect the electric machine (8) to the electronic power converter (13);
a second power wiring (21) comprising at least two second electric wires (26), which connect the electronic power converter (13) to the storage system (14); and
a cooling system (30), which is designed to remove heat and is thermally coupled to at least one power wiring (15; 21) in order to remove heat from the power wiring (15; 21);
wherein each electric wire (20, 26) comprises a core (27) made of a conductor material and an insulating jacket (28), which covers the conductor material core (27); and
wherein in the area of the two opposite ends, each electric wire (20, 26) has no insulating jacket (28), thus exposing the conductor material core (27) to which a head (30) is steadily connected, which ensures a connection to a corresponding terminal (17, 19, 23, 25) of a terminal board (16, 18, 22).

2. The road vehicle (1) according to claim 1, wherein the cooling system (30) is thermally coupled to the sole insulating jacket (28) of a corresponding electric wire (20, 26) in order to remove heat from an outer surface of the insulating jacket (28).

3. The road vehicle (1) according to claim 1, wherein the cooling system (30) is thermally coupled to the sole heads (29) of a corresponding electric wire (20, 26) in order to remove heat from the heads (29).

4. The road vehicle (1) according to claim 1, wherein the cooling system (30) comprises a cooling circuit (32) where a cooling fluid flows and is provided with a heat exchanger (31), which is thermally coupled to at least one power wiring (15; 21) in order to remove heat from the wiring (15; 21).

5. The road vehicle (1) according to claim 4, wherein the cooling circuit (32) is provided with an air radiator, which is hit by an air flow when the vehicle (1) is moving and where the cooling fluid releases heat to the outside.

6. The road vehicle (1) according to claim 4, wherein the cooling system (30) uses a compression refrigeration cycle to cool down the cooling fluid.

7. The road vehicle (1) according to claim 4, wherein the heat exchanger (31) has a tubular shape and surrounds, namely is arranged around, a corresponding electric wire (20, 26).

8. The road vehicle (1) according to claim 4, wherein:
there is at least one terminal board (16, 18, 22, 24) provided with terminals (17, 19, 23, 25) to which at least one corresponding electric wire (20, 26) is connected; and
the heat exchanger (31) rests against the terminal board (16, 18, 22, 24).

9. The road vehicle (1) according to claim 1, wherein the cooling system (30) comprises a refrigeration circuit (35), which contains a refrigerant fluid and comprises, in turn, a compressor (36), a condenser (37), an expansion valve (38) and at least one evaporation organ, which is thermally coupled to at least one power wiring (15; 21) in order to remove heat from the wiring (15; 21).

10. The road vehicle (1) according to claim 9, wherein the evaporation organ is physically separate from the power wiring (15; 21), is thermally coupled to the power wiring (15; 21) and determines a fluid-tight insulation between the refrigerant fluid and the power wiring (15; 21).

11. The road vehicle (1) according to claim 9, wherein the power wiring (15; 21) is at least partially inserted in a fluid-tight casing (44), which receives the refrigerant fluid from the expansion valve (38), sends the refrigerant fluid to the compressor (36) and makes up the evaporation organ.

12. The road vehicle (1) according to claim 11, wherein:
there is at least one terminal board (16, 18, 22, 24) provided with terminals (17, 19, 23, 25) to which at least one corresponding electric wire (20, 26) is connected; and
the terminal board (16, 18, 22, 24) is inserted in the fluid-tight casing (44) making up the evaporation organ.

13. A road vehicle (1) with an electric drive comprising:
at least one pair of drive wheels (3);
a reversible electric machine (8), which is connected to the drive wheels (3);
an electronic power converter (13), which controls the electric machine (8);
an electric energy storage system (14), which is connected to the electronic power converter (13);
a first power wiring (15) comprising at least two first electric wires (20), which connect the electric machine (8) to the electronic power converter (13);
a second power wiring (21) comprising at least two second electric wires (26), which connect the electronic power converter (13) to the storage system (14); and a cooling system (30), which is designed to remove heat and is thermally coupled to at least one power wiring (15; 21) in order to remove heat from the power wiring (15; 21);

wherein each electric wire (20, 26) comprises a core (27) made of a conductor material and an insulating jacket (28), which covers the conductor material core (27);

wherein in the area of the two opposite ends, each electric wire (20, 26) is naked, namely has no insulating jacket (28), thus exposing the conductor material core (27) to which a head (30) is steadily connected, which ensures a connection to a corresponding terminal (17, 19, 23, 25) of a terminal board (16, 18, 22); and wherein the cooling system (30) is thermally coupled to the sole heads (29) of a corresponding electric wire (20, 26) in order to remove heat from the heads (29).

14. A road vehicle (1) with an electric drive comprising:
at least one pair of drive wheels (3);
a reversible electric machine (8), which is connected to the drive wheels (3);
an electronic power converter (13), which controls the electric machine (8);
an electric energy storage system (14), which is connected to the electronic power converter (13);
a first power wiring (15) comprising at least two first electric wires (20), which connect the electric machine (8) to the electronic power converter (13);
a second power wiring (21) comprising at least two second electric wires (26), which connect the electronic power converter (13) to the storage system (14);
at least one terminal board (16, 18, 22, 24) provided with terminals (17, 19, 23, 25) to which at least one corresponding electric wire (20, 26) is connected; and
a cooling system (30), which is designed to remove heat and is thermally coupled to at least one power wiring (15; 21) in order to remove heat from the power wiring (15; 21);
wherein the cooling system (30) comprises a cooling circuit (32) where a cooling fluid flows and is provided with a heat exchanger (31), which is thermally coupled to at least one power wiring (15; 21) in order to remove heat from the wiring (15; 21) and rests against the terminal board (16, 18, 22, 24).

15. A road vehicle (1) with an electric drive comprising:
at least one pair of drive wheels (3);
a reversible electric machine (8), which is connected to the drive wheels (3);
an electronic power converter (13), which controls the electric machine (8);
an electric energy storage system (14), which is connected to the electronic power converter (13);
a first power wiring (15) comprising at least two first electric wires (20), which connect the electric machine (8) to the electronic power converter (13);
a second power wiring (21) comprising at least two second electric wires (26), which connect the electronic power converter (13) to the storage system (14); and
a cooling system (30), which is designed to remove heat and is thermally coupled to at least one power wiring (15; 21) in order to remove heat from the power wiring (15; 21);
wherein the cooling system (30) comprises a refrigeration circuit (35), which contains a refrigerant fluid and comprises, in turn, a compressor (36), a condenser (37), an expansion valve (38) and at least one evaporation organ, which is thermally coupled to at least one power wiring (15; 21) in order to remove heat from the wiring (15; 21).

16. The road vehicle (1) according to claim 15, wherein the evaporation organ is physically separate from the power wiring (15; 21), is thermally coupled to the power wiring (15; 21) and determines a fluid-tight insulation between the refrigerant fluid and the power wiring (15; 21).

17. The road vehicle (1) according to claim 15, wherein the power wiring (15; 21) is at least partially inserted in a fluid-tight casing (44), which receives the refrigerant fluid from the expansion valve (38), sends the refrigerant fluid to the compressor (36) and makes up the evaporation organ.

18. The road vehicle (1) according to claim 17, wherein:
there is at least one terminal board (16, 18, 22, 24) provided with terminals (17, 19, 23, 25) to which at least one corresponding electric wire (20, 26) is connected; and
the terminal board (16, 18, 22, 24) is inserted in the fluid-tight casing (44) making up the evaporation organ.

* * * * *